United States Patent
Satou et al.

(10) Patent No.: US 7,097,090 B2
(45) Date of Patent: Aug. 29, 2006

(54) SOLDER BALL

(75) Inventors: Isamu Satou, Souka (JP); Shinichi Nomoto, Hanyu (JP); Hiroshi Okada, Souka (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 321 days.

(21) Appl. No.: 10/242,797

(22) Filed: Sep. 13, 2002

(65) Prior Publication Data

US 2004/0050903 A1    Mar. 18, 2004

(51) Int. Cl.
    *B23K 35/14*    (2006.01)

(52) U.S. Cl. .................. 228/56.3; 228/246; 420/570

(58) Field of Classification Search ............... 228/56.1, 228/245, 246; 420/557–563, 566, 570–573, 420/580, 587, 589
See application file for complete search history.

(56) References Cited

U.S. PATENT DOCUMENTS

| | | | | |
|---|---|---|---|---|
| 4,173,468 A | * | 11/1979 | Gault | 420/559 |
| 5,120,498 A | * | 6/1992 | Cocks | 420/580 |
| 5,127,969 A | * | 7/1992 | Sekhar | 148/23 |
| 5,284,287 A | * | 2/1994 | Wilson et al. | 228/180.22 |
| 5,308,578 A | * | 5/1994 | Wong | 420/558 |
| 5,653,783 A | * | 8/1997 | Ohzeki | 75/340 |
| 5,675,889 A | * | 10/1997 | Acocella et al. | 29/830 |
| 5,690,890 A | * | 11/1997 | Kawashima et al. | 420/559 |
| 5,919,317 A | * | 7/1999 | Tanahashi et al. | 148/24 |
| 6,189,771 B1 | * | 2/2001 | Maeda et al. | 228/248.1 |
| 6,205,264 B1 | * | 3/2001 | Jin et al. | 385/14 |
| 6,340,113 B1 | * | 1/2002 | Avery et al. | 228/248.5 |
| 6,367,683 B1 | * | 4/2002 | Rass et al. | 228/121 |
| 6,485,843 B1 | * | 11/2002 | Eslamy | 428/548 |
| 6,506,448 B1 | * | 1/2003 | Minogue | 427/216 |

FOREIGN PATENT DOCUMENTS

| | | | |
|---|---|---|---|
| JP | 7-178587 | * | 7/1995 |
| JP | 07178587 | | 7/1995 |
| JP | 07195189 | | 8/1995 |
| JP | 10-109187 | * | 10/1996 |
| JP | 9-52191 | * | 2/1997 |
| JP | 10-137971 | * | 5/1998 |
| JP | 11-114691 | * | 4/1999 |
| JP | 2002-153990 | * | 5/2002 |

OTHER PUBLICATIONS

Sato et al., Translation to JP 2002-153990, May 2002, 5 pages.*

* cited by examiner

*Primary Examiner*—Jonathan Johnson
(74) *Attorney, Agent, or Firm*—Michael Tobias

(57) ABSTRACT

A solder ball is formed from an Sn—Pb alloy which consists essentially of about 2–65 mass % of Sn, 0–5 mass % of Ag, about 0.1–1 mass % of Sb, and 0.01–0.1 mass % of Cu, and 0.01–0.1 mass % of Bi, and a balance of Pb and incidental impurities. The solder ball has improved thermal fatigue resistance, good solderability, and good surface brightness after soldering.

11 Claims, 1 Drawing Sheet

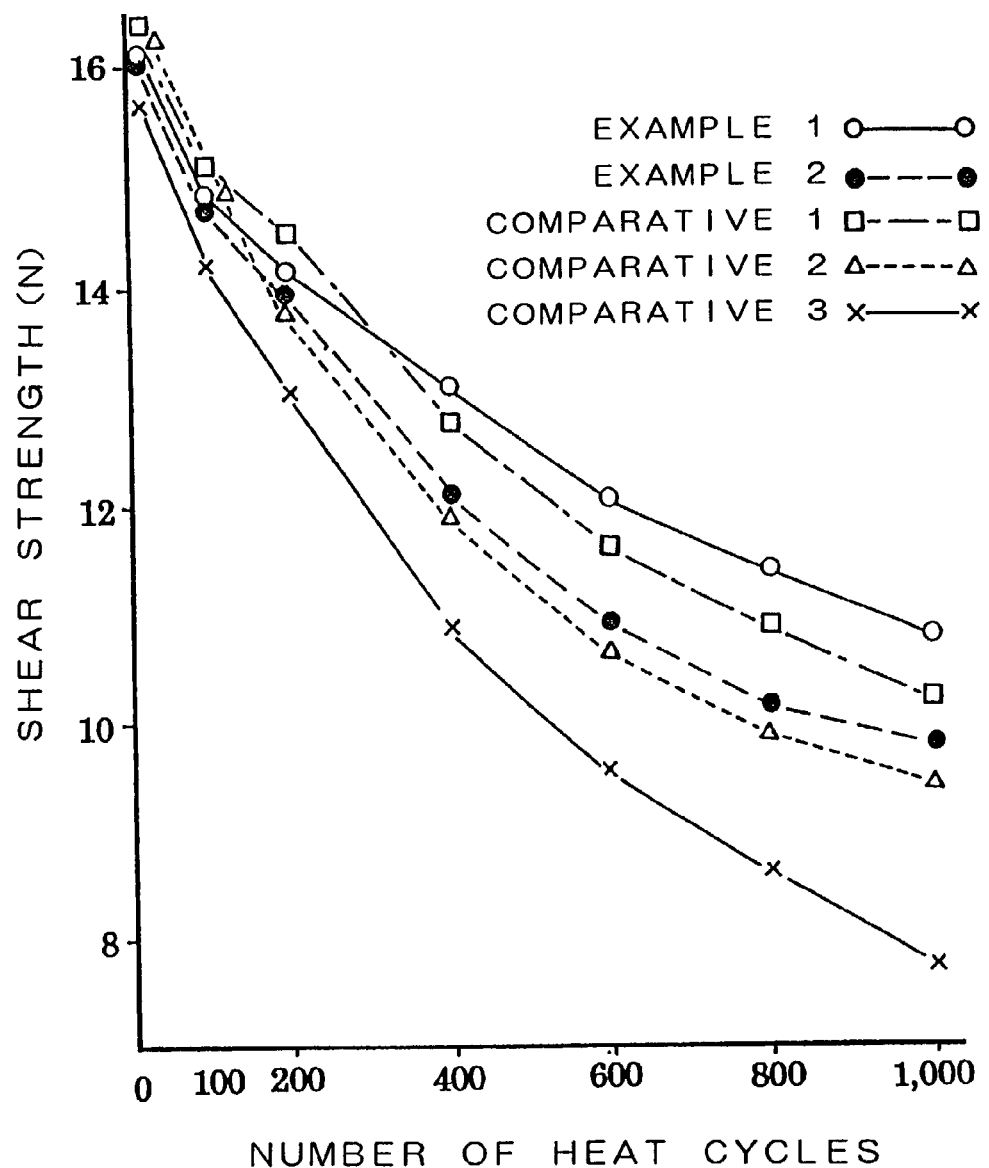

SOLDER BALL

BACKGROUND OF THE INVENTION

1. Field of the Invention

The present invention relates to solder balls for use in soldering electronic devices. More specifically, the present invention relates to solder balls made from an Sn—Pb system alloy for use in soldering an electronic package, such as a BGA package or a CSP (chip-scale package), to a printed circuit board.

2. Description of the Related Art

The size of electronic equipment is continually decreasing. At the same time, electronic devices used in electronic equipment are also becoming smaller, even as they perform more and more functions. In order to prepare multi-purpose electronic devices in the form of a package, a plurality of IC's must be installed in the package with a plurality of flat electrical leads connected to each of the IC's extending to outside the package. The greater the number of IC's which are installed, the greater the number of electrical leads which are required. Therefore, the package must have as many external electrical leads as possible. Examples of conventional multi-purpose packages are QFP's (Quad Flat Packages) and SOP's (Small Outline Packages), which have leads extending from two or more sides thereof. However, QFP's and SOP's require the provision of leads on their side walls, and there is a limit to the number of leads which can be provided in these locations. The maximum number of leads which can be provided on the side walls of a QFP or SOP is 200 even when the space between the leads and the width of each lead are made as small as possible.

Recently, multi-purpose packages having improved functions and requiring a larger number of leads than do QFP's and SOP's have been developed. These new types of packages are called BGA (Ball Grid Array) packages and CSP's (Chip Scale Packages). BGA packages and CSP's (collectively referred to hereunder as "BGA-type packages") are packages in which an IC is installed on the upper surface of a package substrate, and small ball-shaped electrodes connected to the IC on the upper surface are provided on the lower surface of the substrate. These ball-shaped electrodes function as external leads. Since a BGA-type package has a number of fine ball-shaped electrodes arranged in a lattice on a plane, a greater number of electrodes can be provided than with conventional QFP's, and the functions of a BGA-type package can be improved accordingly.

When a BGA-type package is mounted on a printed circuit board, a solder bump is formed on each of the lands of the BGA-type package, each of the solder bumps is positioned on one of the lands of the printed circuit board, and then the solder bumps are melted to carry out soldering of the BGA-type package to the printed circuit board. A solder ball is used to preform each solder bump.

In general, a solder ball used to preform a solder bump of a BGA-type package is made from an Sn—Pb solder alloy. The Sn—Pb solder alloy defined in JIS Standards contains 2–95 mass % of Sn. However, the Sn—Pb solder alloy especially used to prepare a solder bump contains 2–65 mass % of Sn.

Of these Sn—Pb solder alloys, a solder alloy containing 2–10 mass % of Sn has a solidus temperature of 260° C. or higher and a liquidus temperature of 300° C. or higher, so a 2–10% Sn—Pb solder alloy is considered to be a high temperature solder alloy. A high temperature solder alloy is usually used to carry out a double soldering process. According to the double soldering process, when soldering a heat-sensitive electronic device and an electronic device which is less sensitive to heat, the latter device is first soldered using a high temperature solder, and then the heat-sensitive device is soldered using a 63% Sn—Pb eutectic solder alloy, i.e., a low temperature solder alloy in order to avoid remelting of the first-soldered joint at the time of the second soldering.

Among these Sn—Pb solder alloys, an Sn—Pb alloy containing 55–65 mass % of Sn is predominantly used, and an Sn—Pb alloy containing 60–65 mass % of Sn is still more widely used. An Sn—Pb system alloy has a eutectic point at 63 mass % of Sn, and the eutectic temperature is 183° C., which is the lowest liquidus temperature of Sn—Pb system alloys. When a solder alloy having an alloy composition near the eutectic point is used, the soldering temperature can be lowered, resulting in a reduced level of thermal influences. Thus, in order to carry out soldering of usual electronic devices, an Sn—Pb solder alloy having an alloy composition near the eutectic composition is most widely employed.

An Sn—Pb alloy containing 1–5 mass % of Ag is also widely used. This is because the presence of a small amount of Ag in the Sn—Pb alloy can avoid so-called "silver dissolution". "Silver dissolution" is a phenomena in which, when an Ag-containing electrical lead or an Ag or Ag—Pb plating is subjected to soldering, the Ag contained therein dissolves into a molten solder alloy metal to make the lead thinner or to deplete the plating. Silver dissolution can be avoided when soldering an Ag-containing lead or Ag-containing plating by using an Sn—Pb solder alloy containing 1–5 mass % of Ag.

In general, a solder joint has poor resistance to thermal fatigue, and when it is subjected to heat cycles including heating at high temperatures and cooling to low temperatures, cracking and de-bonding easily occur, resulting in the breakage of electrical connections of electronic devices. Such heat cycles occur because an electronic device generates heat and therefore rises in temperature when conducting, while its temperature returns to room temperature when it is turned off. The repeated heating and cooling of an electronic device also subjects solder joints for the device to heat cycles.

A printed circuit board on which soldering is performed is made of a resin, which has a coefficient of expansion which is markedly different from that of a solder alloy, and the expansion and shrinkage of the solder alloy in a solder joint during a heat cycle are restricted by the printed circuit board, resulting in stresses in the solder joint. Such stresses then result in fatigue of the solder joint, which causes cracking and peeling-off of the solder joint. In particular, since the soldering area is very small for a BGA-type package, such cracking and peeling-off easily occur when a solder alloy with poor thermal fatigue is employed to form a solder joint.

Solder balls used for connecting a BGA-type package to a printed circuit board usually have a diameter of 0.76 mm. Recently, extremely small solder balls having a diameter of 0.15 mm or 0.1 mm are being used. Solder balls for use with a BGA-type package bond the BGA-type package and a printed circuit board to each other through the electrodes of the package. However, solder balls are very small, and their bonding area is also very small. For example, when a BGA-type package and a printed circuit board are bonded using solder balls with a diameter of 0.5 mm, the diameter of the resulting solder bump is 0.4 mm, and the bonding area is a very small value of as low as 0.12 mm$^2$ for each of the electrodes. Thus, since a solder joint has a very small bonding area, it easily suffers from cracking and peeling-off when the solder alloy which constitutes the solder joint undergoes thermal fatigue.

A solder alloy for use in soldering BGA-type packages requires not only thermal fatigue resistance, but also surface brightness after soldering. Surface brightness is required because after soldering, inspection must be carried out by an image processing technique. A large number of solder balls are placed on a BGA substrate, and reflow of the solder balls in a reflow furnace is carried out to form solder bumps on the substrate. If even one of these solder bumps is not well-formed, i.e., if soldering does not occur or bridging to the neighboring bumps occurs, the resulting BGA-type package does not function properly. Thus, after formation of solder bumps, inspection using an image processing technique must be carried out. For this reason solder bumps must be bright so that inspection can be carried out efficiently.

It is known that when a very small amount of a third element is added to an Sn—Pb system alloy, the resistance to thermal fatigue can be improved. Japanese Patent Application Laid-Open Specification No.7-178587/1995, for example, discloses the addition of 0.1–5 mass % of Ag, 0.1–10 mass % of Sb, and 0.005–0.3 mass % of P to an Sn—Pb alloy to improve thermal fatigue resistance. Japanese Patent Application Laid-Open Specification No. 7-195189/1995 discloses the addition of 0.1–2 mass % of Bi, 0.03–0.3 mass % of Cu, and 0.1–2 mass % of Sb to an Sn—Pb alloy to improve thermal fatigue resistance.

These thermal fatigue resisting solder alloys have the problem that they do not exhibit a satisfactory level of solderability, although they can exhibit improved thermal fatigue resistance. In the past, these thermal fatigue resisting solder alloys were used to carry out soldering over a relatively large bonding area, e.g., they were used for soldering of wire leads or flat leads to large lands of printed circuit boards. In such applications, even if a small area remains unsoldered, there is no problem if the resulting solder joint as a whole has a given level of thermal fatigue resistance.

However, in the case of BGA-type packages, which have a very small area for bonding to a printed circuit board, if an unsoldered portion remains even in a small local area, the BGA-type packages are easily disconnected or they do not work. A solder alloy for use in bonding BGA-type packages must therefore have much improved solderability.

It has also been learned that conventional solder alloys do not exhibit an adequate level of surface brightness after soldering. It is rather difficult, therefore, to carry out inspection of the resulting solder bumps with image processing techniques.

SUMMARY OF THE INVENTION

The present invention provides an Sn—Pb alloy for use in preparing solder balls which can exhibit not only improved thermal fatigue resistance but also improved solderability and surface brightness after soldering.

The inventors of the present invention investigated the reasons why conventional thermal fatigue resisting solder alloys do not exhibit satisfactory solderability and surface brightness after soldering.

The inventors found that conventional solder alloys contain a variety of alloying elements in large amounts, and these alloying elements adversely affect solderability, i.e., wettability, as well as surface brightness after soldering, even though they are all effective for improving thermal fatigue resistance. The present inventors focused their attention on Sb, Cu and Bi of these alloying elements and determined the relationship between the content of each of these elements and solderability and surface brightness after soldering. The present inventors found that when these alloying elements are added in certain amounts, the thermal fatigue resistance as well as solderability and surface brightness after soldering of the resulting solder alloys are satisfactory.

According to one aspect of the present invention, a solder ball comprises an Sn—Pb solder alloy which consists essentially of about 2–65 mass % and preferably about 5–63 mass % of Sn, 0–5 mass % of Ag, about 0.1–1 mass % of Sb, about 0.01–0.1 mass % of Cu, about 0.01–0.1 (exclusive) mass % of Bi, and a balance of Pb and incidental impurities.

According to another aspect of the present invention, a solder ball comprises an Sn—Pb solder alloy which consists essentially of about 2–65 mass % of Sn, about 1–5 mass % of Ag, about 0.1–1 mass % of Sb, about 0.01–0.1 mass % of Cu, about 0.01–0.1 (exclusive) mass % of Bi, and a balance of Pb and incidental impurities.

According to another aspect of the present invention, a BGA-type package has at least one solder ball on a lower surface thereof, the solder ball comprising a solder alloy consisting essentially of about 2–65 mass % of Sn, 0–5 mass % of Ag, about 0.1–1 mass % of Sb, about 0.01–0.1 mass % of Cu, about 0.01–0.1 mass % of Bi, and a balance of Pb and incidental impurities.

BRIEF DESCRIPTION OF THE DRAWINGS

The sole FIGURE is a graph of the shear strength of solder joints as a function of the number of heat cycles for examples of the present invention and comparative examples.

DESCRIPTION OF PREFERRED EMBODIMENTS

When a solder alloy employed in the present invention contains about 2–10 mass % of Sn, it has a solidus temperature of 268° C. or higher and a liquidus temperature of 301° C. or higher. This type of solder alloy is useful as a high temperature solder alloy. For general use, it is preferable to use a solder alloy containing 60–63 mass % of Sn. A eutectic composition for an Sn—Pb alloy contains 63 mass % of Sn and has a eutectic temperature of 183° C. In order to avoid thermal damage to BGA-type package, it is preferable to employ an alloy composition near the eutectic composition. The melting point and solderability are not influenced substantially if the content of Sn is a little higher or lower than 63 mass %. However, Sn is an expensive material, and it is preferable to choose a lower content thereof than 63 mass % from the viewpoint of economy. Thus, in view of its melting point and economy, the content of Sn is preferably 60–63 mass %.

When the content of Sb is lower than about 0.1 mass %, the thermal fatigue resistance is not improved. On the other hand, the presence of more than about 1 mass % of Sb adversely affects solderability. A preferable content of Sb is about 0.15–0.6 mass %.

When Cu is added in an amount of less than about 0.01 mass %, the thermal fatigue resistance cannot be improved. Addition of more than about 0.1 mass % of Cu adversely affects solderability, and surface brightness after soldering is deteriorated. A preferable content of Cu is about 0.02–0.08 mass %.

When Bi is added in an amount of less than about 0.01 mass %, the thermal fatigue resistance cannot be improved. When Bi is added in an amount of 0.1 mass % or over, surface brightness after soldering is deteriorated. A preferable content of Bi is about 0.02–0.07 mass %.

Ag may be added to the alloy so as to further improve mechanical properties, including strength. When Ag is added in an amount of less than about 1 mass %, the intended properties are not improved. In contrast, when Ag is added in an amount of over 5 mass %, a deterioration in solderability is inevitable.

Solder balls of the present invention may be prepared in accordance with conventional processes including a spherical formation process in oil and a direct spherical formation process. In the spherical formation in oil, a solder wire is cut into chips of a given length and the chips are supplied to a hot oil bath. Chips supplied to the hot bath will melt to form a spherical shape due to the surface tension of the molten solder. In the direct spherical formation process, molten solder is extruded in a pulverized form through a small nozzle into an oil bath to form spherical solder due to the surface tension of the molten solder.

There is no limit to the size of the solder ball of the present invention. Sizes such as those which can be used to form solder bumps for BGA-type packages, and CSP's, for example, are satisfactory. A preferable size is 0.05–1.0 mm in diameter.

EXAMPLES

Solder balls measuring 0.5 mm in diameter and having the solder compositions shown in the following table were placed on lands measuring 6 mm in diameter of a BGA substrate. After placement of the solder balls on the lands, the BGA substrate was subjected to heating in a reflow furnace to carry out soldering between the solder balls and the lands. After forming solder bumps by the soldering, a visual inspection of solderability by image processing was performed for the solder joints between the solder bumps and the BGA substrate.

When the solder spread fully over the electrodes of the BGA substrate, the result was indicated as "Excellent". When the solder spread over almost the entire area of the electrodes of the BGA substrate, the result was indicated as "Good". When the solder did not spread thoroughly over the electrodes, the result was indicated as "Poor".

Surface brightness was evaluated in three grades. When a clear bright surface was obtained, the result was indicated as "excellent". When the surface was less bright, the results was indicated as "Good". When the brightness was lost, the result was indicated as "Poor".

|  | Solder Composition | | | | | | Properties | |
| --- | --- | --- | --- | --- | --- | --- | --- | --- |
|  | Pb | Sn | Sb | Cu | Bi | Ag | P | Solderability | Surface Brighness |
| Example 1 | bal. | 63 | 0.25 | 0.04 | 0.04 |  |  | Excellent | Excellent |
| Example 2 | bal. | 63 | 0.25 | 0.04 | 0.04 | 2 |  | Good | Good |
| Comparative 1 | bal. | 63 | 2 | 2 | 1 |  |  | Poor | Poor |
| Comparative 2 | bal. | 63 | 5 |  |  | 5 | 5 | Poor | Poor |
| Comparative 3 | bal. | 63 |  |  |  |  |  | Excellent | Excellent |

The same BGA substrate was subjected to 100–1000 heat cycles, each cycle including cooling at −65° C. for 15 minutes, holding at room temperature for 5 minutes, and heating at +150° C. for 15 minutes. A shearing test was carried out for the BGA substrate after a predetermined number of heat cycles were applied to determine the shear strength of the solder joints of the BGA substrate.

The sole FIGURE is a graph showing the resulting shear strength with respect to the number of heat cycles performed.

As is apparent from the results shown in the above table and the FIGURE a solder ball in accordance with the present invention can show an improved and satisfactory level of thermal fatigue resistance over conventional alloys, with the improvement increasing as the number of heat cycles increases.

What is claimed is:

1. A solder ball comprising a solder alloy consisting essentially of about 2–10 mass % of Sn, 0–5 mass % of Ag, about 0.1–1 mass % of Sb, about 0.01–0.1 mass % of Cu, about 0.01–0.1 mass % of Bi, and a balance of Pb and incidental impurities.

2. A solder ball as set forth in claim 1 wherein the alloy contains about 1–5 mass % of Ag.

3. A soldering method comprising performing reflow soldering of a substrate, using a solder ball as set forth in claim 1.

4. A soldering method as set forth in claim 3 wherein the substrate is a substrate of a BGA-type package.

5. A BGA-type package having at least one solder ball as set forth in claim 1 on a lower surface thereof.

6. A solder ball as set forth in claim 1 wherein the alloy contains about 0.15–0.6 mass % of Sb.

7. A solder ball as set forth in claim 1 wherein the alloy contains about 0.02–0.08 mass % of Cu.

8. A solder ball as set forth in claim 1 wherein the alloy contains about 0.02–0.07 mass % of Bi.

9. A solder ball as set forth in claim 1 wherein the solder ball is formed into a spherical shape in an oil bath.

10. A solder ball as set forth in claim 1 wherein the solder ball has a diameter of 0.05–1.0 mm.

11. A method of forming a solder ball comprising placing a solder alloy having the composition set forth in claim 1 into an oil bath to form the alloy into a solder ball having a diameter of 0.05–1.0 mm.

* * * * *